US008426843B2

(12) United States Patent
Albrecht et al.

(10) Patent No.: US 8,426,843 B2
(45) Date of Patent: Apr. 23, 2013

(54) RADIATION-EMITTING SEMICONDUCTOR BODY

(75) Inventors: Tony Albrecht, Bad Abbach (DE); Stefan Bader, Pentling-Matting (DE); Berthold Hahn, Hemau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 255 days.

(21) Appl. No.: 12/680,620

(22) PCT Filed: Aug. 28, 2008

(86) PCT No.: PCT/DE2008/001447
§ 371 (c)(1),
(2), (4) Date: Jul. 26, 2010

(87) PCT Pub. No.: WO2009/039815
PCT Pub. Date: Apr. 2, 2009

(65) Prior Publication Data

US 2010/0294957 A1 Nov. 25, 2010

(30) Foreign Application Priority Data

Sep. 28, 2007 (DE) ........................ 10 2007 046 499

(51) Int. Cl.
*H01L 33/30* (2010.01)

(52) U.S. Cl.
USPC .................................... 257/13; 257/E33.067

(58) Field of Classification Search .................... 257/13, 257/E33.067
See application file for complete search history.

(56) References Cited

U.S. PATENT DOCUMENTS

| | | | | |
|---|---|---|---|---|
| 6,576,933 | B2 * | 6/2003 | Sugawara et al. | 257/103 |
| 6,677,617 | B2 | 1/2004 | Tominaga | |
| 2002/1013998 | | 10/2002 | Sugawara et al. | |
| 2003/1000643 | | 1/2003 | Shibata et al. | |
| 2006/0145137 | A1 | 7/2006 | Wang et al. | |
| 2007/0205426 | A1 | 9/2007 | Inoshita et al. | |
| 2009/0101934 | A1 | 4/2009 | Massies et al. | |

FOREIGN PATENT DOCUMENTS

| | | |
|---|---|---|
| DE | 10 2004 052 245 | 2/2006 |
| EP | 1 132 977 | 9/2001 |
| JP | 11-274558 | 10/1999 |
| JP | 2000-174346 | 6/2000 |
| JP | 2001-352098 | 12/2001 |
| JP | 2003-078165 | 3/2003 |
| JP | 2006-041077 | 2/2006 |

(Continued)

OTHER PUBLICATIONS

I. Schnitzer et al., "30% external quantum efficiency from surface textured, thin-film light-emitting diodes", Appl. Phys. Lett. vol. 63, No. 16, pp. 2174-2176, Oct. 18, 1993.

(Continued)

*Primary Examiner* — Zandra Smith
*Assistant Examiner* — Paul Patton
(74) *Attorney, Agent, or Firm* — Cozen O'Connor

(57) ABSTRACT

Described is a radiation-emitting semiconductor body (1) with an active layer (2) for generation of radiation of a first wavelength ($\lambda_1$) and a reemission layer (3) which comprises a quantum well structure (4) comprising a quantum layer structure (5) and a barrier layer structure (6). The reemission layer is intended for generation of incoherent radiation of a second wavelength ($\lambda_2$) by absorption of the radiation of the first wavelength in the barrier layer structure.

14 Claims, 3 Drawing Sheets

FOREIGN PATENT DOCUMENTS

| | | |
|---|---|---|
| JP | 2006-295132 | 10/2006 |
| JP | 2007-235103 | 9/2007 |
| WO | WO 02/097902 | 12/2002 |
| WO | WO 2006/098250 | 9/2006 |
| WO | WO 2007/104884 | 9/2007 |

OTHER PUBLICATIONS

English Translation of Office Action issued on Nov. 6, 2012 in the corresponding Japanese Patent Application No. 2010-526149.

* cited by examiner

RADIATION-EMITTING SEMICONDUCTOR BODY

RELATED APPLICATIONS

This is a U.S. national stage of application No. PCT/DE2008/001447, filed on Aug. 28, 2008.

This application claims the priority of German application no. 10 2007 046 499.3 filed Sep. 28, 2007, the entire content of which is hereby incorporated by reference.

FIELD OF THE INVENTION

Background of the Invention

With conventional light-emitting diodes there is the possibility of generating mixed color radiation in that radiation of a first wavelength is generated by a semiconductor body and is then converted to radiation of a second wavelength by means of a phosphor. Thus the semiconductor body in combination with the phosphor emits mixed color radiation of the first and second wavelengths.

Making such a light-emitting diode, however, requires exact matching of the phosphor to the relevant emission wavelength of the semiconductor body and a precise metering and application method for the phosphor.

SUMMARY OF THE INVENTION

One object is to specify a semiconductor body that can be made in a simplified manner. In particular, the semiconductor body should have high efficiency in operation.

One object is to provide a semiconductor body that can be made in a simplified manner. In particular, the semiconductor body should have high efficiency in operation.

Another object is to provide an efficient method for generating mixed color radiation or for conversion of radiation by means of a semiconductor.

In the radiation-emitting semiconductor body an active layer for generation of radiation of a first wavelength and a reemission layer, which comprises a quantum well structure comprising a quantum layer structure and a barrier layer structure, is formed, where the reemission layer is intended to generate incoherent radiation of a second wavelength by means of absorption of the radiation of the first wavelength in the barrier layer structure. Preferably, the radiation of the first wavelength generated by the active layer is also incoherent.

The term quantum well structure in this connection comprises in particular any structure in which the charge carrier can undergo quantization of its energy states by confinement. In particular, the term quantum well structure does not imply any information about the dimensionality of the quantization. Thus it comprises, among other things, quantum wells, quantum wires and quantum dots and any combination of these structures.

In case of doubt, an “active layer” is understood to mean an electrically excitable radiation-generating layer. On the other hand, the reemission layer is optically pumped.

The active layer for generation of radiation of a first wavelength and the reemission layer for at least partial conversion of the radiation of the first wavelength to radiation of the second wavelength are monolithically integrated in the semiconductor body. The metering and application of a phosphor for conversion of the radiation of the first wavelength to radiation of the second wavelength can thus advantageously be omitted.

In addition, radiation losses induced by a phosphor, for example scattering losses, are avoided. With that, the efficiency of the radiation-emitting semiconductor body is advantageously improved.

In addition, characteristic optical parameters of the semiconductor body such as chromaticity and/or color temperature of the generated radiation are already set in the fabrication of the semiconductor body. Through this, cost advantages can be achieved in the fabrication, especially in the fabrication of the semiconductor body in a wafer process.

Finally, an appearance of color in switched-off state, as can be caused, for example, with conventional light-emitting diodes by the phosphor, is avoided. Such an appearance of color is often undesirable. Special fabrication steps to avoid such an appearance of color, which can additionally lead to a lower efficiency or to darkening of the semiconductor body, are not necessary.

In a preferred development of the semiconductor body the barrier layer structure comprises one or more barrier layers. Correspondingly, the quantum layer structure may also comprise one or more quantum layers.

Additionally preferably, the barrier layers and the quantum layers are arranged alternatingly. An alternating arrangement means that in the sequence of barrier and quantum layers a barrier layer always follows a quantum layer, and vice versa.

The quantum well structure can thus be designed as a single quantum well structure (SQW), or multiple quantum well structure (MQW), where the quantum well or wells each is formed by a quantum layer between two adjacent barrier layers.

In another embodiment of the semiconductor body the radiation of the second wavelength is generated in the quantum layer structure, thus for instance in the quantum layer or layers. The spatial separation of absorption of the radiation of the first wavelength and generation of the radiation of the second wavelength has the advantage of higher efficiency of the reemission layer and with that the radiation-emitting semiconductor body. In particular, the barrier layers are made to be considerably thicker than the quantum layers, so that the absorption of the radiation of the first wavelength is considerably greater in the barrier layers and with that all in all the stimulation of the reemission layer is considerably more efficient than if there is absorption of the radiation of the first wavelength in the quantum layer structure or the corresponding quantum layers.

In another advantageous design the semiconductor body contains a compound semiconductor material, in particular a nitride compound semiconductor material or a phosphide compound semiconductor material.

In particular, the radiation-emitting semiconductor body may be based on a compound semiconductor material, more preferably on a nitride compound semiconductor material or a phosphide compound semiconductor material. These semiconductor materials are characterized by especially efficient radiation generation, wherein advantageously through the monolithic integration of the reemission layer one can achieve an emission spectrum that usually cannot be generated with an active layer based on a nitride or phosphide compound semiconductor alone.

In particular, optical parameters of the semiconductor body such as chromaticity and/or color temperature can be freely established in wide limits by the appropriate design of the reemission layer.

“Based on nitride compound semiconductors” in this connection means that the semiconductor body, preferably the active layer and/or the reemission layer or at least a partial layer thereof, contains a nitride III/V compound semiconductor material, preferably $Al_nGa_mIn_{1-n-m}N$, where $0 \leqq n \leqq 1$, $0 \leqq m \leqq 1$ and $n+m \leqq 1$, preferably with $n \neq 0$ and/or $m \neq 0$. This material does not absolutely have to have a mathematically exact composition in accordance with the above formula. Rather it can have one or more dopants and additional components that do not significantly change the characteristic physical properties of the $Al_nGa_mIn_{1-n-m}N$ material. For the sake of simplicity the above formula contains only the important components of the crystal lattice (Al, Ga, In, N), even though they can be partly replaced by small amounts of other substances.

"Based on phosphide compound semiconductors" in this connection means that the semiconductor body, preferably the active layer and/or the reemission layer or at least a partial layer thereof, contains a phosphide III/V compound semiconductor material, preferably $Al_nGa_mIn_{1-n-m}P$, where $0 \leqq n \leqq 1$, $0 \leqq m \leqq 1$ and $n+m \leqq 1$, preferably with $n \neq 0$ and/or $m \neq 0$. This material does not absolutely have to have a mathematically exact composition in accordance with the above formula. Rather it can have one or more dopants and additional components that do not significantly change the characteristic physical properties of the $Al_nGa_mIn_{1-n-m}P$ material. For the sake of simplicity the above formula contains only the important components of the crystal lattice (Al, Ga, In, P), even though they can be partly replaced by small amounts of other substances.

In a preferred embodiment of the semiconductor body the radiation of the first wavelength is only partially converted to radiation of the second wavelength by means of the reemission layer, so that the semiconductor body serves for simultaneous emission of radiation of the first wavelength and radiation of the second wavelength.

Additionally preferably, the first wavelength can lie in the blue spectral region, for instance at a wavelength between 440 nm and 470 nm inclusive, and the second wavelength can lie in the yellow-orange spectral range, so that mixed color radiation with a white overall color impression will be emitted. The semiconductor body in this embodiment is a monolithically integrated white light source.

Alternatively, it can also be provided that the radiation of the first wavelength is converted essentially completely to radiation of the second wavelength by means of the reemission layer, so that the radiation-emitting semiconductor body thus only emits radiation of the second wavelength in operation. For example, it can be provided that the active layer generates ultraviolet radiation, which is completely converted to radiation with a second wavelength in the visible spectral region, for example in the green spectral region. In an advantageous development of this alternative the semiconductor body may be provided on the side where the radiation is radiated with a reflection layer that selectively reflects the radiation of the first wavelength back to the semiconductor body. The reflected portions of the radiation are thus sent again to the reemission layer for conversion.

Thus, in each case according to the requirement, mixed-color radiation or radiation of a wavelength that does not correspond to the emission wavelength of the active layer of the semiconductor body can be generated with the radiation-emitting semiconductor body.

In the case of a semiconductor body based on a nitride compound semiconductor material the active layer preferably contains InGaN.

Further preferably, the first wavelength lies between 360 nm and 400 nm, wherein the boundaries are included.

In another preferred development the barrier layer structure contains GaN.

An active layer containing InGaN is especially suitable in combination with a barrier layer structure based on GaN which is especially efficiently excitable with said wavelength in a range between 360 nm and 400 nm.

A semiconductor body based on a nitride compound semiconductor material is also suitable for generation of radiation in the blue spectral range, for instance at a wavelength between 440 nm and 470 nm, inclusive.

Preferably, the radiation-emitting semiconductor body is embodied as a thin film semiconductor body.

A thin film semiconductor body is characterized in particular by at least one of the following characteristic features:

- a reflecting layer is deposited or formed on a first main surface of a radiation-generating epitaxial layer sequence turned toward a carrier, the reflecting layer reflecting at least a part of the electromagnetic radiation generated in the epitaxial layer sequence back to it;
- the epitaxial layer sequence has a thickness in the range of 20 μm or less, in particular in the range of 10 μm; and/or
- the epitaxial layer sequence contains at least one semiconductor layer with at least one surface, which has a through-mixing structure, which in the ideal case leads to a nearly ergodic distribution of the light in the epitaxial epitaxy layer sequence, i.e., it has scattering behavior that is as ergodically stochastic as possible.

A basic principle of a thin layer light emitting diode chip is described, for example, in I. Schnitzer et al., Appl. Phys. Lett. 63 (16), Oct. 18, 1993, 2174-2176, the disclosure content of which to that extent is hereby incorporated by reference.

A thin film light-emitting diode chip is, to a good approximation, a Lambert surface radiator.

Alternatively, the semiconductor body can also be provided with a substrate in the form of a growth substrate (also called the epitaxial substrate), which is preferably transparent for the generated radiation of the first and/or the second wavelength.

In an advantageous development the semiconductor body is provided with a mirror layer on a side opposite to the radiation side. Through this the proportion of the radiation side coupled radiation is advantageously increased. In addition, the radiation of the first wavelength going back and forth to the mirror layer can form a standing wave field. In this case it is preferable for the reemission layer to be arranged at a peak of the standing wave field, thus an antinode. Through this an advantageously high absorption of the radiation of the first wavelength is achieved and with that the efficiency of generation of the radiation of the second wave is increased.

In the method for generating mixed color radiation or for conversion of radiation by means of a semiconductor body the semiconductor body contains an active layer and a reemission layer. The reemission layer comprises a quantum well structure comprising a quantum layer structure and a barrier layer structure. The generation of mixed color radiation or the conversion of radiation takes place with the following steps:

- generation of preferably incoherent radiation of a first wavelength ($\lambda_1$) in the active layer;
- at least partial absorption of the radiation of a first wavelength ($\lambda_1$) in the barrier layer structure, and
- generation of incoherent radiation of a second wavelength ($\lambda_2$) in the quantum layer structure.

If only a part of the radiation of the first wavelength is absorbed in the barrier layer structure, the remaining portion of the radiation of the first wavelength can be radiated away with the radiation of the second wavelength generated in the quantum layer structure, so that all in all mixed color radiation is generated that in particular contains spectral fractions of the first and the second wavelengths.

Alternatively, the radiation of the first wavelength may be completely absorbed in the barrier layer structure, so that complete conversion of the radiation of the first wavelength to radiation of the second wavelength takes place.

"Completely" in this connection means that, apart from negligible or unavoidable residual fractions of the radiation of the first wavelength the semiconductor body emits only radiation of the second wavelength in the main direction of radiation. To be sure, conversion of energy of the radiation of the first wavelength to radiation of the second wavelength that is as complete as possible is desired, but is not absolutely necessary.

Preferably, the method is carried out by means of a semiconductor body with at least one of the features described above.

DETAILED DESCRIPTION OF THE DRAWINGS

Like elements or elements with like functions are indicated in the figures with the same reference numbers.

Figure 1:
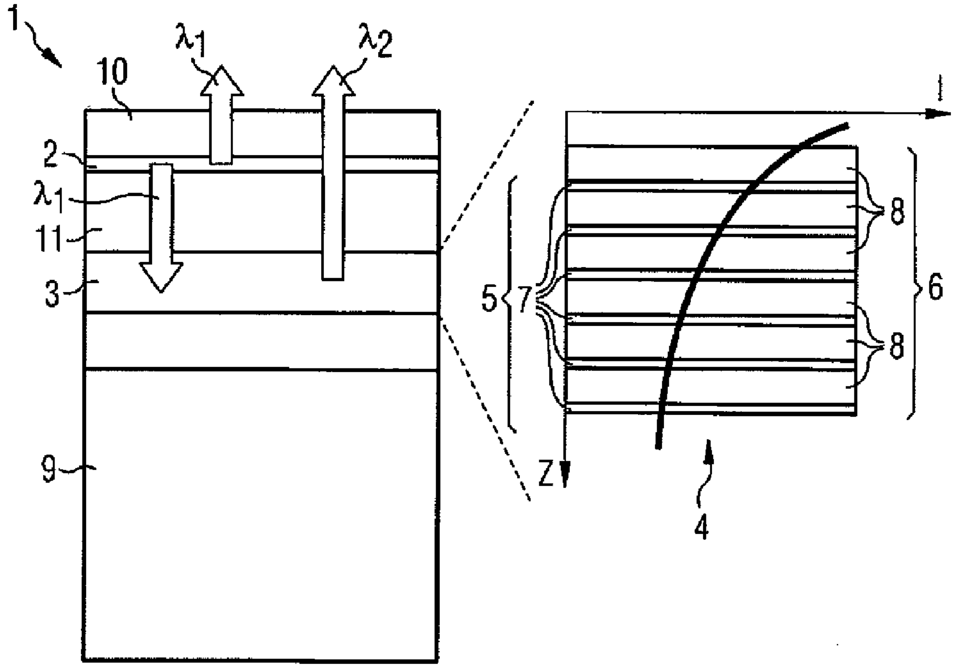
FIG. 1 shows a schematic sectional view of a first exemplary embodiment of the semiconductor body.

FIG. 1 shows a radiation-emitting semiconductor body 1 comprising a radiation-generating active layer 2 and a reemission layer 3.

A substrate 9, for example a growth substrate, on which the reemission layer 3 and active layer 2 are epitaxially grown, is arranged on the side of the semiconductor body that faces away from the main radiation side.

Alternatively, the semiconductor body may also be designed as a thin film semiconductor body, where in this case the growth substrate is made thinner or preferably completely removed and the semiconductor body is applied to an external carrier.

In operation radiation of a first wavelength $\lambda_1$ is generated by means of the active layer 2. A part of this radiation of the first wavelength $\lambda_1$ is absorbed in the reemission layer 3 that is arranged under the active layer 2, which leads to emission of radiation of a second wavelength $\lambda_2$. Thus, radiation of wavelength $\lambda_1$ is at least partly converted to radiation of the wavelength $\lambda_2$ in the reemission layer 3.

As the enlarged section of the reemission layer 3 in FIG. 1 shows, the reemission layer 3 comprises a quantum well structure 4 with a quantum layer structure 5 and a barrier layer structure 6. The quantum layer structure 5 comprises a plurality of quantum layers 7. Correspondingly, the barrier layer structure 6 comprises a plurality of barrier layers 8. The quantum well structure in this case is thus formed as a multiple quantum well structure (MQW), where the quantum layers 7 and barrier layers 8 are alternatingly arranged.

By appropriate dimensioning of the quantum well structure the wavelength $\lambda_2$ of the radiation generated by the reemission layer and furthermore the chromaticity and/or the color temperature of the radiation overall emitted by the semiconductor body can be freely established in wide limits.

Moreover, it is possible to vary the composition and/or the thickness of the barrier and/or quantum layers in the reemission layer in the vertical direction, so that the spectral width of the radiation generated by the reemission layer is increased. This is advantageous, for example, in the generation of white light, when an overall impression that is similar to an incandescent lamp with a broad white light spectrum is desired.

In the enlarged section of the reemission layer 3 in FIG. 1, moreover, the intensity I of the radiation of wavelength $\lambda_1$ is schematically plotted in the vertical direction z, thus along the direction of growth of the quantum well structure 4. Because of the absorption of the radiation of wavelength $\lambda_1$ in the barrier layers 8 of the barrier layer structure 6 the intensity I of the radiation of wavelength $\lambda_1$ decreases continuously with increasing distance z from the active layer 2.

The semiconductor body 1 may, for example, be designed on the basis of a nitride compound semiconductor. In this case the active layer 2, for example, may be arranged between an upper side p-GaN layer 10 and an n-GaN layer 11. The active layer 2 may be based on InGaN and likewise may be designed as a single or multiple quantum well structure.

Preferably, wavelength $\lambda_1$ of the radiation generated by the active layer is chosen so that sufficiently high absorption is achieved in the barrier layers 8 of the reemission layer 3. Barrier layers based on GaN in combination with an active layer based on InGaN are especially suitable for this.

Figure 2:
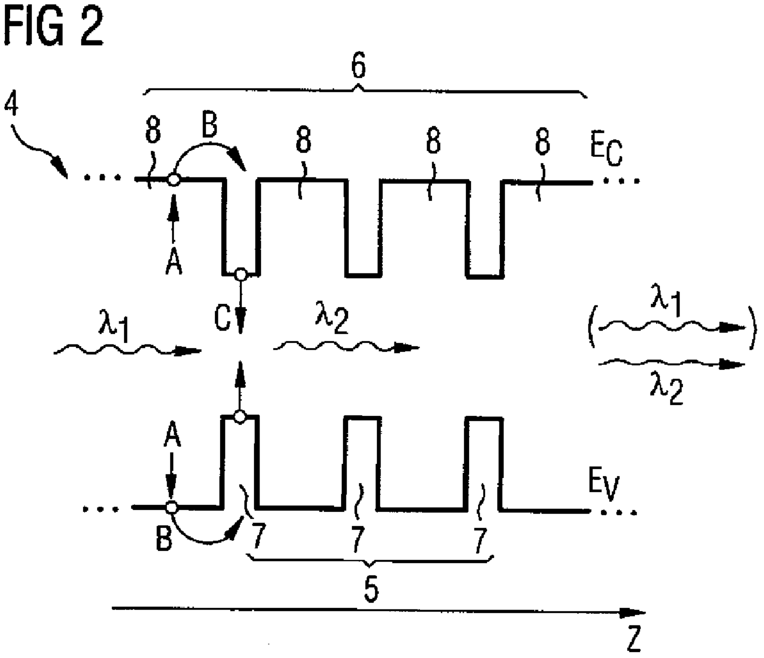
FIG. 2 shows a schematic view of an exemplary embodiment of the method for generating mixed color radiation or for conversion of radiation.

FIG. 2 schematically shows how, by means of the semiconductor body, radiation of the first wavelength $\lambda_1$ is partly or entirely converted to radiation of the second wavelength $\lambda_2$.

A segment of the energy level $E_v$ of the valence band and the energy level $E_c$ of the conduction band of the reemission layer is plotted.

In operation the radiation of the first wavelength $\lambda_1$ generated by the active layer is absorbed in barrier layer structure 6, thus in the barrier layers 8, of the reemission layer, through which at first a charge carrier separation takes place in the barrier layers 8 (step A). The separated charge carriers become trapped in the energetically lower quantum wells of the quantum well structure 4, thus in the quantum layers 7 of the quantum layer structure 5 (step B) and there lead to emission of radiation with the wavelength $\lambda_2$ through recombination (step C).

Figure 3:
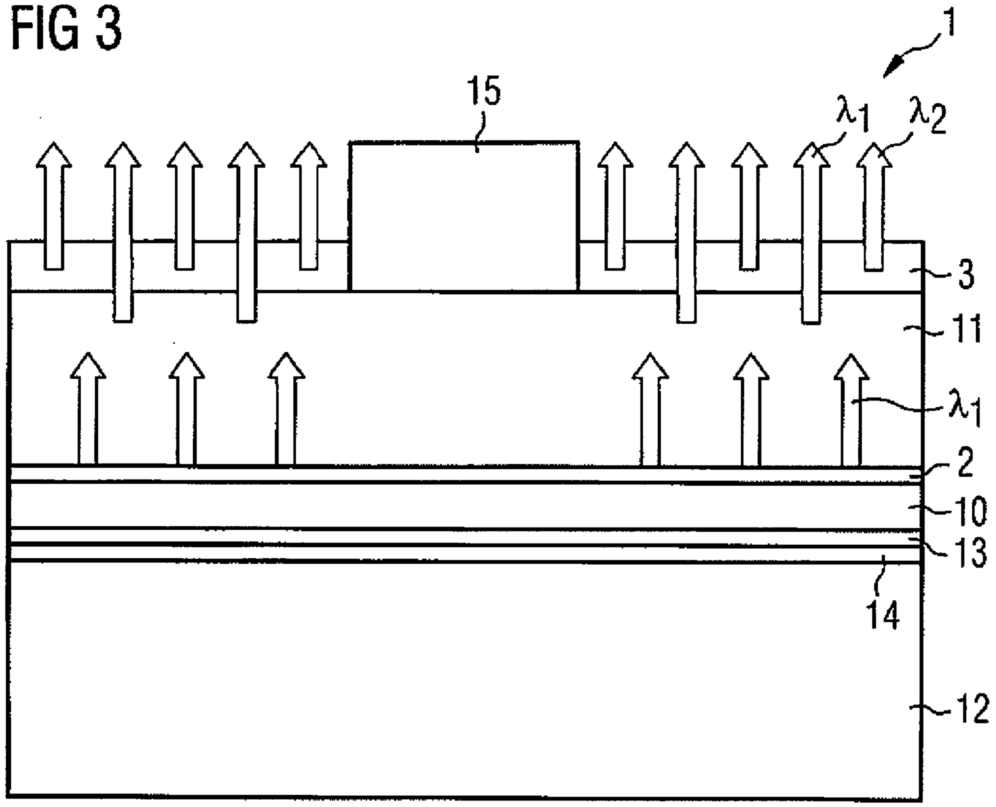
FIG. 3 shows a schematic sectional view of a second exemplary embodiment of the semiconductor body.

FIG. 3 shows another exemplary embodiment of the semiconductor body. In contrast to the semiconductor body shown in FIG. 1, this semiconductor body is made as a thin film semiconductor body.

As in the previous example, the semiconductor body has an active layer 2 and a reemission layer 3. The reemission layer 3 may be designed as the preceding exemplary embodiment as a multiple quantum well structure with a plurality of alternatingly arranged barrier and quantum layers.

The reemission layer 3 is applied to an n-GaN layer 3 on the radiation side. The n-GaN layer serves, among other things, for the current spreading in the semiconductor body. The active layer 2 is arranged between the n-GaN layer 11 and a p-GaN layer 10. With regard to the type of conduction the semiconductor body shown in FIG. 3 is the inverse of the one shown in FIG. 1.

Generally speaking in this connection the reemission layer may be p-conducting, n-conducting, undoped or even codoped. Independent thereof, the reemission layer may be arranged between a substrate or carrier and the active layer or on a side of the active layer that is remote from the substrate or carrier.

In contrast to the previous exemplary embodiment, the semiconductor body 1 shown in FIG. 3 is applied to a carrier 12, and the epitaxial substrate (not shown) was dissolved away from the semiconductor body. A contact layer 13 and then a solder layer 14 to connect the semiconductor body to carrier 10 are made on the side of the semiconductor body 1 that faces the carrier 12.

In addition, a mirror layer (not shown), which serves to reflect radiation emitted in the direction of the carrier 12, may be arranged between the semiconductor body and the carrier, so that these fractions of the radiation are also emitted on the upper side radiation side of the semiconductor body. An embodiment of the mirror layer in the form of a dielectric applied to the semiconductor or a TCO (transparent conductive oxide) layer applied to the semiconductor, in which a metal layer is arranged on the side turned away from the semiconductor body, is advantageous. A high degree of reflection by the mirror layer can be achieved in this way.

Parts of the radiation of the first wavelength going back and forth to the mirror layer may form a standing wave field. In this case the reemission layer 3 is preferably arranged in a wave peak. An advantageously high absorption of the radiation of the first wavelength $\lambda_1$ is achieved through this and with that the efficiency of generation of the radiation of the second wavelength $\lambda_2$ is increased.

A contact 15 in the form of a bond pad is made on the side turned away from carrier 12 for electrical supply of the semiconductor body.

As already noted, radiation of the first wavelength $\lambda_1$ is generated in the active layer 2. A part of this layer is absorbed within the reemission layer 3 in the barrier layer structure and leads to emission of radiation of the second wavelength $\lambda_2$. This radiation of the second wavelength $\lambda_2$ is emitted together with the remaining part of the radiation of the first wavelength $\lambda_1$ so that the semiconductor body emits mixed color radiation. If the active layer and the reemission layer are designed so that the first wavelength $\lambda_1$ lies in the blue spectral region and the second wavelength $\lambda_2$ lies in the yellow orange spectral region, a white color impression may result. In this advantageous embodiment the semiconductor body is a monolithically integrated white light source.

Figure 4:
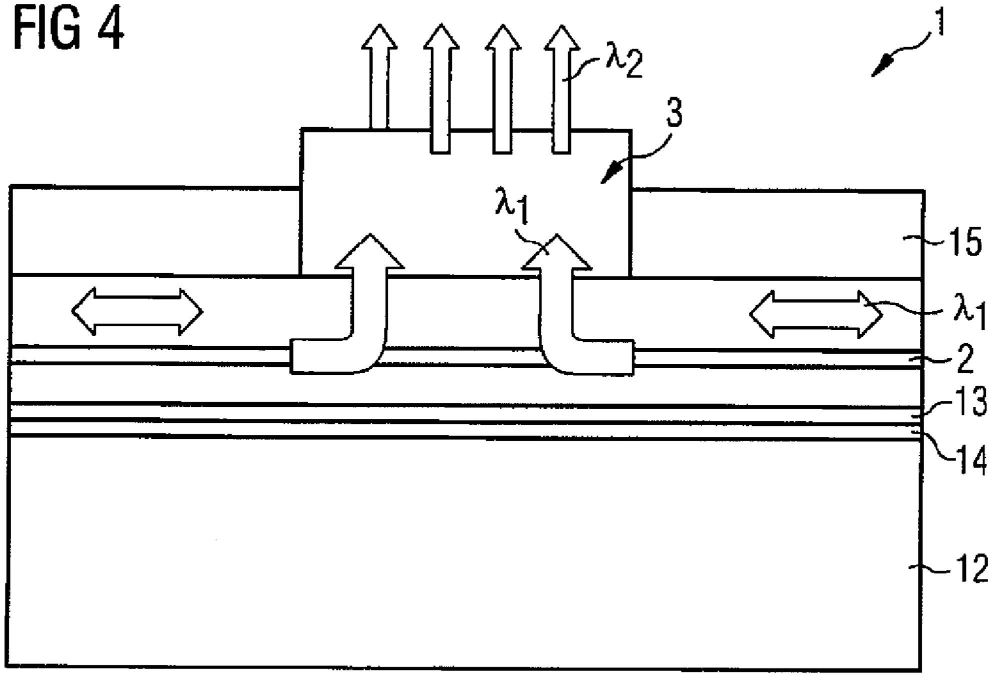
FIG. 4 shows a schematic sectional view of a third exemplary embodiment of the semiconductor body.

FIG. 4 shows another exemplary embodiment of the semiconductor body 1 in the form of a thin film semiconductor body.

As in the preceding exemplary embodiment, this semiconductor body has a reemission layer 3 and an active layer 2 and additionally is connected to a carrier 12 via a contact layer 13 and a solder layer 14. As in the preceding exemplary embodiment a mirror layer (not shown) may be arranged between the semiconductor body 1 and the carrier 12.

In contrast to the preceding exemplary embodiment the lateral extension of the reemission layer 3 is smaller than the corresponding lateral extension of the active layer 2. In this way the generation of the radiation of the second wavelength $\lambda_2$ can be concentrated on a comparably small area, so that a point light source as it were with high radiation density is formed.

In this case the radiation of the first wavelength $\lambda_1$ is preferably completely converted to radiation of the second wavelength or the exit of the radiation of the first wavelength $\lambda_1$ is blocked outside of the reemission layer 3. This can take place, for example, by arranging the contact 15 on the side of the reemission layer 3 and thus blocking exit of the radiation of the first wavelength $\lambda_1$ in this region. The radiation of the first wavelength $\lambda_1$ may lie, for example, in the ultraviolet spectral region and be converted to radiation in the visible spectral region, for example in the green spectral region.

Alternatively or in addition, a waveguide may be provided, which likewise blocks exit of the radiation of the first wavelength to the side from the reemission layer 3. For example, the contact layers of the semiconductor body may be designed to be reflecting, so that a waveguide is formed between these contact layers.

Figure 5:
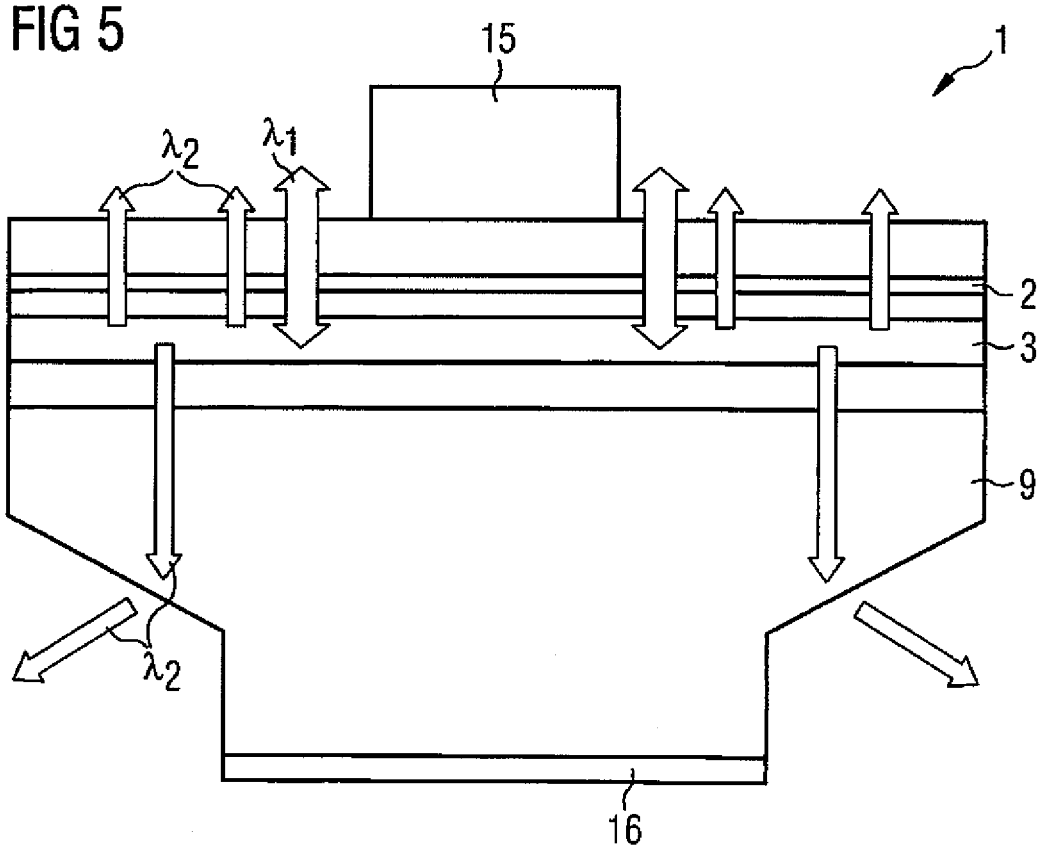
FIG. 5 shows a schematic sectional view of a fourth exemplary embodiment of the semiconductor body.

FIG. 5 shows a fourth exemplary embodiment of the radiation-emitting semiconductor body 1.

In contrast to the two preceding exemplary embodiments, this semiconductor body has an epitaxial substrate 9 that is transparent for the generated radiation of the first wavelength $\lambda_1$ and/or the second wavelength $\lambda_2$.

The reemission layer 3 and then the active layer 2 are epitaxially grown in succession on the epitaxial substrate 9. On the top is a contact 15 in the form of a bond pad on the semiconductor body.

Preferably, the substrate is electrically conductive and in addition has a counter contact 16 on the opposite side of the contact for electrical supply of the semiconductor body.

The radiation of the first wavelength $\lambda_1$ generated in the active layer 2 propagates in part in the direction of the reemission layer 3 and there is at least partly converted to radiation of the second wavelength $\lambda_2$. Radiation of the first and second wavelength can be radiated by the semiconductor body on the top side. In addition, radiation through the radiation-permeable substrate is possible. Here it is advantageous to provide the substrate in the manner shown with recesses, which increase the coupling-out efficiency of the generated radiation.

A corresponding shaping of the substrate, in which one or more side walls of the substrate 9 have an oblique section of the side wall, which becomes a vertical side wall section, is described in DE Patent DE 100 06 738, the disclosure content of which to that extent is incorporated by reference.

This patent application claims the priority of the German Patent Application 10 2007 046 499.3, the disclosure content of which is herewith incorporated by reference.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A radiation-emitting semiconductor body comprising:
- an active layer for generation of radiation of a first wavelength;
- a reemission layer, which comprises a quantum well structure with a quantum layer structure and a barrier layer structure, the reemission layer being provided for generation of incoherent radiation of a second wavelength by absorption of the generated radiation of the first wavelength in the barrier layer structure and for emission in a direction from the reemission layer of the generated radiation of the second wavelength; and
- a contact formed on the radiation-emitting semiconductor body, the contact and the reemission layer being arranged side-by-side such that the contact blocks radiation of the first wavelength from exiting the active layer in the direction except toward the reemission layer.

2. The radiation-emitting semiconductor body as in claim 1, wherein the radiation of the first wavelength is incoherent.

3. The radiation-emitting semiconductor body as in claim 1, wherein the quantum layer structure comprises at least one quantum layer and the barrier layer structure comprises at least one barrier layer.

4. The radiation-emitting semiconductor body as in claim 1, wherein the radiation of the second wavelength is generated in the quantum layer structure.

5. The radiation-emitting semiconductor body as in claim 1, wherein the active layer contains InGaN and the barrier layer structure contains GaN.

6. The radiation-emitting semiconductor body as in claim wherein the first wavelength lies between 360 nm and 400 nm inclusive.

7. The radiation-emitting semiconductor body as in claim 1, wherein the first wavelength lies in the blue spectral region and the radiation-emitting semiconductor body is intended for emission of white light.

8. The radiation-emitting semiconductor body as in claim 1, wherein the reemission layer converts the radiation of the first wavelength partly to radiation of the second wavelength so that the radiation-emitting semiconductor body is intended for emission of radiation of the first wavelength and the second wavelength.

9. The radiation-emitting semiconductor body as claim 1, wherein the reemission layer converts the radiation of the first wavelength completely to radiation of the second wavelength.

10. The radiation-emitting semiconductor body as in claim 1, wherein the semiconductor body is a thin film semiconductor body.

11. The radiation-emitting semiconductor body as in claim 1, wherein the radiation-emitting semiconductor body comprises a growth substrate, which is transparent for at least one of the radiation of the first wavelength and the radiation of the second wavelength.

12. The radiation-emitting semiconductor body as in claim 1, wherein a lateral extension of the reemission layer is smaller than a corresponding lateral extension of the active layer.

13. The radiation-emitting semiconductor body as in claim 1, wherein the active layer and the reemission layer are monolithically integrated in the semiconductor body.

14. A method for producing mixed-color radiation or for conversion of radiation by a semiconductor body including an active layer and a reemission layer, wherein the reemission layer includes a quantum well structure comprising a quantum layer structure and a barrier layer structure, the method comprising the steps of:

generating preferably incoherent radiation of a first wavelength in the active layer;

at least partially absorbing the generated radiation of a the first wavelength in the barrier layer structure;

generating incoherent radiation of a second wavelength in the quantum layer structure; and locating a contact on the semiconductor body so that the contact and the reemission layer are arranged side-by-side to block the generated radiation of the first wavelength from exiting the active layer at the location of the contact.

* * * * *